United States Patent [19]

Ingraham

[11] Patent Number: 4,731,548

[45] Date of Patent: Mar. 15, 1988

[54] TOUCH CONTROL SWITCH CIRCUIT

[75] Inventor: Ronald D. Ingraham, Quincy, Mich.

[73] Assignee: Nartron Corporation, Reed City, Mich.

[21] Appl. No.: 913,084

[22] Filed: Sep. 29, 1986

[51] Int. Cl.⁴ .......................................... H01H 35/00
[52] U.S. Cl. ................................... 307/116; 307/308; 307/632; 200/DIG. 1
[58] Field of Search ............... 307/116, 125, 252, 308; 315/34, 74, 208, 246, 362; 318/345, 446; 323/19, 24; 328/5; 200/DIG. 1

[56] References Cited

U.S. PATENT DOCUMENTS

| | | | |
|---|---|---|---|
| 3,549,909 | 12/1970 | Adelson et al. | 307/252 |
| 3,641,410 | 2/1972 | Vogelsberg | 318/345 |
| 3,651,391 | 3/1972 | Vogelsberg | 318/446 |
| 3,666,988 | 5/1972 | Bellis | 307/116 X |
| 3,899,713 | 8/1975 | Barkan et al. | 307/308 X |
| 3,919,596 | 11/1975 | Bellis | 307/308 X |
| 3,965,465 | 6/1976 | Alexander | 340/274 R |
| 3,984,757 | 10/1976 | Gott et al. | 315/246 X |
| 4,016,453 | 4/1977 | Moennig | 307/308 X |
| 4,031,408 | 6/1977 | Holz | 307/116 |
| 4,101,805 | 7/1978 | Stone | 307/308 X |
| 4,119,864 | 10/1978 | Petrizio | 307/116 |
| 4,152,629 | 5/1979 | Raupp | 315/362 |
| 4,159,473 | 6/1979 | Senk | 307/116 X |
| 4,210,822 | 7/1980 | Wern | 307/116 |
| 4,211,959 | 7/1980 | Deavenport et al. | 307/308 X |
| 4,213,061 | 7/1980 | Conner | 307/116 |
| 4,246,533 | 1/1981 | Chiang | 307/116 X |
| 4,264,831 | 4/1981 | Wern | 307/116 X |
| 4,289,972 | 9/1981 | Wern | 307/116 |
| 4,289,980 | 9/1981 | McLaughlin | 307/308 |
| 4,308,443 | 12/1981 | Tucker et al. | 307/116 X |
| 4,323,829 | 4/1982 | Witney et al. | 307/116 X |
| 4,360,737 | 11/1982 | Leopold | 307/116 |

Primary Examiner—William M. Shoop, Jr.
Assistant Examiner—Sharon D. Logan
Attorney, Agent, or Firm—Price, Heneveld, Cooper, DeWitt & Litton

[57] ABSTRACT

A touch controlled electronic switching circuit in which the body capacitance of the person actuating the device is coupled in series with current limiting resistors and a capacitor with the junction coupled to a logic circuit which responds thereto to provide a direct current control signal. The logic circuit has an output coupled to the gate terminal of a Triac coupled to a load for selectively applying current to said load during both half-cycles of each cycle of the line voltage supplied to the Triac and load.

19 Claims, 1 Drawing Figure

TOUCH CONTROL SWITCH CIRCUIT

BACKGROUND OF THE INVENTION

The present invention relates to an electrical circuit and particularly to a touch controlled electrical switching circuit.

There exists a variety of electrical switching circuits which respond to a person's touch on a touch pad which can be in the form of a lamp base or a specific surface area of an electrical appliance to be actuated. Such circuits represent a convenient manner by which a consumer can easily operate appliances without the need for manually actuating a conventional toggle, push-button or other type switch. Touch controlled electrical switching circuits have become increasingly popular; for example, in use in controlling table lamps, floor lamps and the like although they have other applications as well. U.S. Pat. Nos. 4,119,864 and 4,360,737 are representative of existing touch controlled switch circuits. Typically, such circuits employ the human body as an antenna for picking up 60 Hz radiation existing in an environment by virtue of the line frequency power in the building and utilizes the induced voltage as a trigger signal for controlling the touch controlled electrical circuit. Such systems, however, can suffer from erratic operation due to variations in the nature of the ambient 60 Hz field and the physiological makeup of the person utilizing the system. Also the prior art systems typically utilize a pulse control for controlling a solid-state switch such as a Triac to be conductive only during a portion of each cycle of operation of the AC power supply thereby reducing the efficiency of such systems.

SUMMARY OF THE PRESENT INVENTION

The system of the present invention provides an improved touch controlled electronic switching circuit in which the body capacitance of the person actuating the device is coupled in a voltage dividing circuit employed to provide a logic output signal for controlling a DC trigger level applied to a Triac or other bilateral solid-state switch coupled between the line voltage source and a load to be controlled. In the preferred embodiment of the invention, the body capacitance is coupled in series with current limiting resistors and a second capacitor with the junction coupled to a solid-state switch for providing a control ouput signal to a logic circuit which responds thereto to provide a direct current control signal. In the preferred embodiment of the invention also, the logic circuit includes a D-flip/flop circuit having its output coupled to the input gate terminal of a Triac for providing a direct current control signal during each half-cycle of each cycle of the line voltage supplied to the Triac and load.

Such a circuit provides improved reliability of operation since it does not rely upon induced voltage for its operation. Further, by utilizing a direct current control signal for the solid-state switch, the Triac switch is rendered conductive near the beginning of each half-cycle of operation and remains conductive during each half-cycle of each cycle of operation. Thus, through a DC gate signal, inductive loads such as fluorescent lights, motors, etc., may be controlled. These and other objects, features and advantages of the present invention can best be understood by reference to the folowing description thereof together with reference to the accompanying drawing in which:

DETAILED DESCRIPTION OF THE PREFERRED EMBODIMENT

Figure 1:
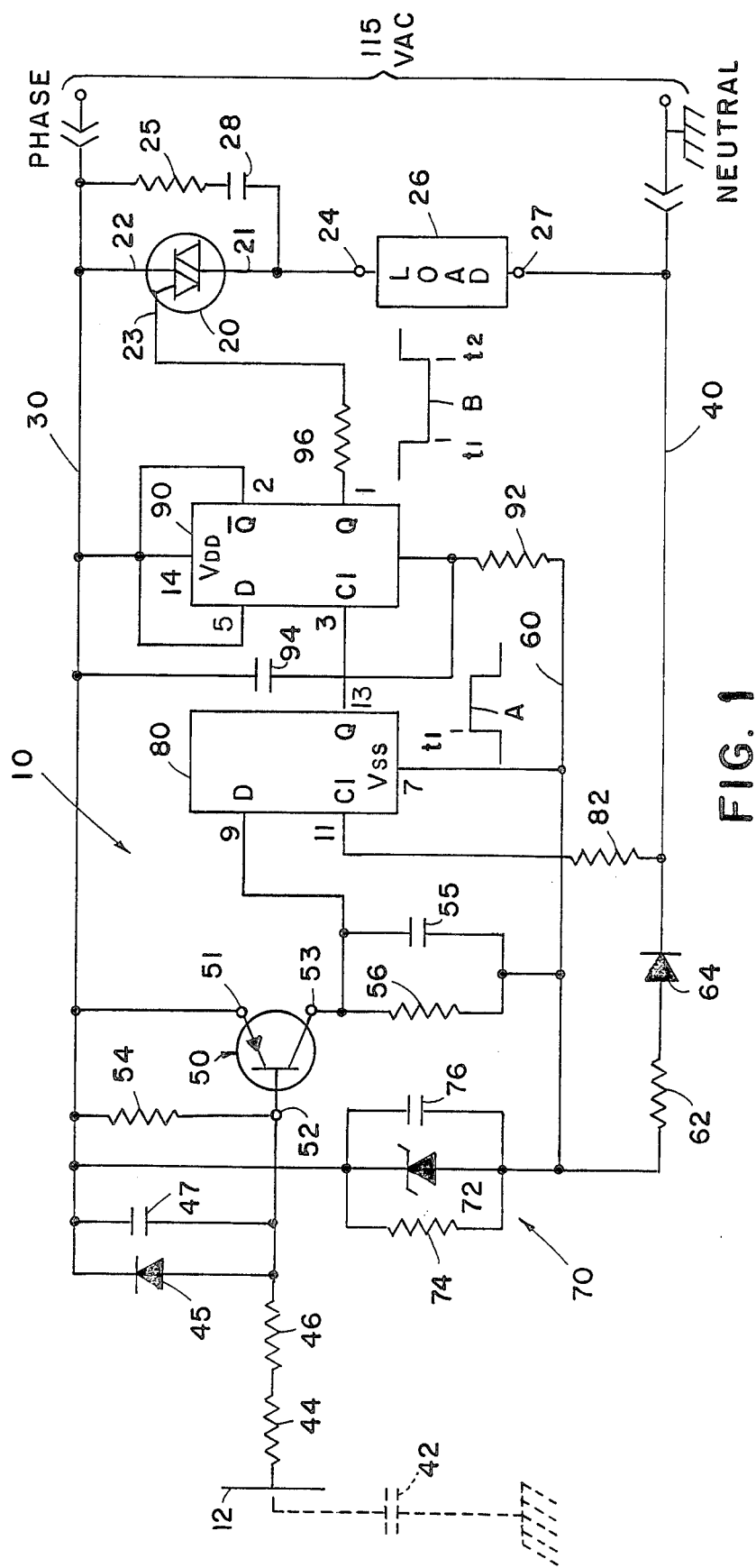
FIG. 1 is an electrical circuit diagram in schematic form of the system of the present invention.

In FIG. 1, the electrical circuit 10 for providing a touch controlled electrical switch is shown and includes a touch plate 12 as its control input element which is touched by a person for actuation of the electrical switching circuit. The switching circuit includes a bidirectional solid-state switch 20 such as a Triac having one power terminal 21 coupled to the one side of the typically 115 volt 60 Hz AC supply line 30 and its remaining power terminal 22 coupled to one terminal 24 of a load 26 to be controlled. The remaining terminal 27 of the load is coupled to the line neutral conductor 40. A series spike suppression resistor 25 and capacitor 28 are coupled across the Triac 20 to prevent false turn-on.

The circuit 10 may include a plug which connects directly into, for example, a wall socket to provide connections for lines 30 and 40 to the building's wiring system and a socket for receiving terminals 24 and 27 of a load 26 such as a lamp to be controlled. The circuit 10 may be built directly into, for example, a base or other mechanical structure associated with a lamp or other appliance and wired directly as shown in FIG. 1 with a plug for plugging directly into a power outlet of the building's power supply system.

The touch plate typically is a conductive element which is insulated from the remaining body or the like of a lamp base or other appliance and is in a location readily accessible by the user. The user's body includes a capacitance portion represented by capacitor 42 in FIG. 1 which may range in a typical person from between 100 to 300 picofarads. When a person touches touch plate 12, this body capacitance is coupled to a series voltage dividing circuit coupled to the AC supply and including at least one other capacitor 47. The touch plate or terminal 12 is coupled to one terminal of a first resistor 44 serially coupled to a second resistor 46 having its terminal remote from resistor 44 coupled to the base terminal 52 of a solid-state switch 50 comprising a PNP transistor. Base 52 is also coupled to line supply conductor 30 by a first diode 45 having a cathode coupled to the conductor 30 and an anode coupled to base terminal 52. Capacitor 47 is also coupled between base terminal 52 and line 30 and is coupled effectively in series with body capacitor 42 to form a capacitive voltage divider including series resistors 44 and 46 between coductor 30 and ground which also corresponds to the ground conductor 40 of the building's supply line. The emitter terminal 41 of transistor 50 is coupled directly to conductor 30 while the collector terminal 53 is coupled to a capacitor 55 coupled in parallel with resistor 56 and having their terminals remote from collector terminal 53 coupled to a negative DC supply conductor 60 which is coupled to the neutral or ground conductor 40 through a resistor 62 and series coupled rectifier diode 64 as shwon in FIG. 1.

Transistor 50 is biased in a normally nonconductive state by a resistor 54 coupled between base terminal 52 and emitter terminal 51 such that in the absence of body capacitace 42, transistor 50 will be nonconductive and capacitor 55 will be discharged by bleeder resistor 56 such that the output signal present at collector terminal 53 of transistor 50 will be a logic zero or low level. This input circuit thus will provide a first control output signal which is at a logic low level when plate 12 is not touched and a second level or logic high level when the plate 12 is touched. The touching of plate completes an AC voltage divider between line 30 and 40 including series capacitors 47 and 42 with resistors 44 and 46 serially. Thus with the presence of capacitor 42, the AC voltage at the base 52 of transistor 50 during the positive half-cycles of the line voltage will be decreased to forwardly bias the emitter-to-base junction thereby rendering transistor 50 conductive. The collector current thus charges capacitor 55 to provide a positive voltage level or logic "1" output signal for application to circuit 80.

Resistors 44 and 46 should each have a resistance of at least 1 megohms, and in the preferred embodiment of the invention, each have a value of 4.7 megohms which provides isolation between touch plate 12 and suppply line 30 so that no harmful electrical current can be supplied to a person touching plate 12. Two serially coupled resistors are employed in the unlikely event that one resistor could short out, the second resistor continues to provide protection for the user of the circuit. Capacitor 47 was a 0.01 Mfd capacitor in the preferred embodiment. Diode 45 prevents the base-to-emitter junction of transistor from being subjected to reverse breakover voltages.

A 15 volt DC power supply 70 is included within circuit 10 for providing power to the logic circuits 80 and 90. Supply 70 includes resistor 62 and diode 64 and a voltage regulator circuit including a 15 volt Zener diode 72 coupled in parallel with a resistor 74 and capacitor 76. One termninal of this parallel combination is coupled to conductor 30, as shown, while the remaining terminal is coupled to DC supply conductor 60 which applies a negative 15 volt DC for the logic circuit now described.

The logic circuit coupled to transistor 50 and to the gate terminal 23 of Triac 20 comprises a two-stage commercially available 4013B integrated circuit having one half coupled as a squaring circuit 80 and the second half coupled as a conventional D-flip/flop circuit 90. The terminal identification numbers on circuits 80 and 90 are the standard commercial identification numbers of the integrated circuit.

The squaring circuit 80 responds to positive going 60 Hz clock pulses from conductor 40 through current limiting resistor 82 which pulses are applied to the clock input terminal 11 of the circuit. The squaring circuit also receives the control signal from the collector of transistor 50 present across resistor 56 which is applied to input terminal 9 which is the D input of the circuit. Circuit 80 responds to a positive signal on input 11 when body capacity 42 is present to provide a positive pulse at the Q output terminal 13. This signal is shown by waveform A in the FIG. and has a pulse width corresponding generally to the length of time plate 12 is touched. Pulse A is applied to input terminal 3 of circuit 90 which has its SET terminal 6 coupled to conductor 60 through resistor 92 and to conductor 30 through capacitor 94 such that when initial power is turned on, this voltage divider holds the SET terminal in a high state assuring that the Q output at terminal 1 remains high and therefore the Triac 20 which is coupled to the Q output terminal 1 of circuit 90 through resistor 96 remains nonconductive when power is initially applied to the circuit. The D and $\bar{Q}$ terminals 5 and 2, respectively, of circuit 9 are intercoupled, while terminal 14 ($V_{DD}$) of circuit 90 is coupled to line 30 as seen in the FIGURE.

OPERATION

Having described the components and their interconnection to form the circuit of the present invention, a description of a cycle of operation is now presented. As noted above, when power is initially applied to the circuit and there is no body capacitance 42 in the circuit, the biasing of the SET terminal of D-flip/flop 90 will maintain the Q output high and therefore the Triac 20 in the nonconductive state. When touch plate 12 is touched thereby adding capacitance 42, as noted earlier, transistor 50 is rendered conductive during the positive half-cycles of each cycle of the AC supply line voltage, thereby charging capacitor 55 and providing a positive output signal indicated by waveform A in the FIGURE at the Q output 13 of squaring circuit 80. This signal is applied to the clock input terminal 3 of D-flip/flop 90 causing the output terminal 1 to switch to the state of terminal 5 which on initial power up was at the low level. Thus, when plate 12 is first touched at a time $t_1$, a negative pulse indicated by waveform B in the FIGURE will be applied to the Triac 20 rendering it conductive and illuminating lamp 26 or applying power to whatever appliance is coupled to terminals 24 and 27.

When the user removes contact with touch plate 12, transistor 50 is nonconductive and capacitor 55 discharges through resistor 56; however, the D-flip/flop 90 is latched and output 1 remains at a direct current low level and the Triac 20 remains conductive during each half-cycle of each cycle of the applied line frequency voltage. The next time, however, touch plate 12 is touched, generating a second positive pulse on input terminal 9 of squaring circuit 80, a second positive pulse also indicated by waveform A is applied to terminal 3 of circuit 90. The flip/flop circuit 90 responds to change states and provide a positive going edge to waveform B indicated at time $t_2$ in the Figure, thereby turning the Triac 20 off and extinguishing lamp 26. Thus, alternate touches of plate 12 will cause flip/flop 90 to change states for providing the control pulse to the Triac 20. Waveform B provides a continuous DC signal as opposed to alternate half-cycle pulses thereby rendering the Triac conductive during the entire cycle of line frequency voltage applied between conductors 30 and 40 which efficiently provides power to lamp 26. A suitable adjustable time delay and reset circuit can be coupled between the squaring circuit 80 and triac 20 to provide an adjustable duty cycle of power to load 26.

The circuit of the present invention therefore provides a relatively inexpensive and efficient circuit in which operation is improved by providing an AC voltage dividing network including the body capacitance as a controlled element and a DC control signal for the gate of a bidirectional switch such as a Triac. The system utilizes a minimum of components with safety features for protecting the user. It will become apparent to those skilled in the art that various modifications to the preferred embodiment of the invention can be made without departing from the spirit or scope thereof as defined by the appended claims.

The embodiments of the invention in which an exclusive property or privilege is claimed are defined as follows:

1. A touch controlled electric switching circuit comprising:

a source of power for the actuation of a load to be selectively coupled to said source of power;

a controllable means for selectively coupling said source to a load; and a control circuit including a series voltage divider input circuit including at least one capacitor having a first terminal connected to said source of power and an input touch terminal for coupling a person's body capacitance in series with said at least one capacitor such that the voltage across said one capacitor produced by said source of power is changed when said input touch terminal is touched and said control circuit provides a control output signal in response to the touching of said touch terminal which signal is applied to said controllable means for selectively coupling said source of power to said load.

2. The circuit as defined in claim 1 wherein said source of power is an alternating current source and wherein said controllable means comprises a first solid-state switch.

3. The circuit as defined in claim 2 wherein said input circuit is coupled to said source of power and includes resistance means coupled in series between said touch terminal and said at least one capacitor.

4. The circuit as defined in claim 3 wherein said resistance means comprises a pair of serially coupled resistors each having a resistance of at least 1 megaohm.

5. A touch controlled electric switching circuit comprising:

a source of power for the actuation of a load to be selectively coupled to said source of power;

a controllable means for selectively coupling said source to a load; and a control circuit including a series voltage divider input circuit including at least one capacitor and an input touch terminal for coupling a person's body capacitance in series with said at least one capacitor such that the voltage between said one capacitor and said touch terminal is reduced when touched and said control circuit provides a control output signal in response to the touching of said touch terminal which signal is applied to said controllable means for selectively coupling said source of power to said load, wherein said source of power is an alternating current source and wherein said controllable means comprises a first solid-state switch, wherein said input circuit is coupled to said source of power and includes resistance means coupled in series between said touch terminal and said at least one capacitor, wherein said resistance means comprises a pair of serially coupled resistors each having a resistance of at least 1 megaohm and, wherein the junction of said at least one capacitor and said resistance means is coupled to a control terminal of a second solid-state switch coupled to said power source and responsive to the change in capacitance and resulting voltage change at said junction to provide a controlling signal.

6. The circuit as defined in claim 5 wherein said control circuit further includes a logic circuit having an input terminal coupled to said second solid-state switch and output terminal coupled to said first solid-state switch, said logic circuit latching in response to successive controlling signals for providing said control output signal.

7. The circuit as defined in claim 6 wherein said logic circuit comprises a squaring circuit serially coupled to a D-flip/flop circuit.

8. A touch controlled electric switching circuit comprising:

a source of alternating current power for the actuation of a load to be selectively coupled to said source;

a first solid-state switch for selectively coupling a load to said source and having a control input terminal for receiving control signals; and a control circuit including a touch plate responsive to the touch of an individual to provide a direct current control output signal applied to said control input terminal such that said first switch is rendered conductive during each half-cycle of each cycle of applied alternating current voltage, wherein said control circuit includes a series voltage divider input circuit including said touch plate and at least one capacitor having a terminal remote from said touch plate connected to said source of alternating current power for coupling a person's body capacitance in series with said at least one capacitor and said source of alternating current power such that said control circuit responds to the change in voltage across said one capacitor to selectively provide said direct current control signal.

9. The circuit as defined in claim 8 wherein said input circuit is coupled to said source of power and includes resistance means coupled in series between said touch plate and said at least one capacitor.

10. The circuit as defined in claim 9 wherein said resistance means comprises a pair of serially coupled resistors each having a resistance of at least 1 megohm.

11. A touch controlled electronic switching circuit comprising:

a source of alternating current power for the actuation of a load to be selectively coupled to said source;

a first solid-state switch for selectively coupling a load to said source and having a control input terminal for receiving control signals; and a control circuit including a touch plate responsive to the touch of an individual to provide a direct current control output signal applied to said control input terminal such that said first switch is rendered conductive during each half-cycle of each cycle of applied alternating current voltage, wherein said control circuit includes a series voltage divider input circuit including at least one capacitor and said touch plate is coupled to said at least one capacitor for coupling a person's body capacitance in series with said at least one capacitor such that said control circuit selectively provides said direct current control signal, said source of power and includes resistance means coupled in series between said touch plate and said at least one capacitor, wherein said resistance means comprises a pair of serially coupled resistors each having a resistance of at least 1 megohm and, wherein the junction of said at least one capacitor and said resistance means is coupled to a control terminal of a second solid-state switch coupled to said power source and responsive to the change in capacitance and resulting voltage change at said junction to provide a controlling signal.

12. The circuit as defined in claim 11 wherein said control circuit further includes a logic circuit having an input terminal coupled to said second solid-state switch and ouput terminal coupled to said first solid-state switch, said logic circuit latching in response to successive controlling signals for providing said control output signal.

13. The circuit as defined in claim 12 wherein said logic circuit comprises a squaring circuit serially coupled to a D-flip/flop circuit.

14. A touch controlled electrical switching circuit for controlling power applied to a load, said circuit comprising:
- a solid-state switch and means for coupling said switch between a load to be controlled and a supply of electrical power, said switch having a control input terminal; and
- a control circuit including an input circuit and a logic circuit for receiving tactile command information from an operator and for providing a control output signal applied to said control input terminal of said solid-state switch, wherein said input circuit includes a touch terminal coupled to at least one capacitor having a terminal remote from said touch terminal coupled to the supply of power to define a voltage divider circuit with a person's body capacitance, said input circuit further including resistance means coupled in series with said touch terminal and said capacitor for limiting current to said touch terminal and voltage level responsive means responsive to said voltage divider circuit for causing said logic circuit to change the state of said control output signal.

15. A touch controlled electrical switching circuit for controlling power applied to a load, said circuit comprising:
- a solid-state switch and means for coupling said switch between a load to be controlled and a supply of electrical power, said switch having a control input terminal; and
- a control circuit including an input circuit and a logic circuit for receiving tactile command information from an operator and for providing a control output signal applied to said control input terminal of said solid-state switch, wherein said input circuit includes a touch terminal coupled to at least one capacitor having a terminal remote from said touch terminal coupled to the supply of power to define a voltage divider circuit, said input circuit further including resistance means coupled in series with said touch terminal and said capacitor for limiting current to said touch terminal, wherein said input circuit further includes a second solid-state switch having a control input terminal coupled to said touch terminal and to the supply of operating power and responsive to the touching of said touch terminal for changing state.

16. The circuit as defined in claim 15 wherein said control circuit further includes a logic circuit including a latching circuit having an output terminal coupled to said control input terminal of said first named solid-state switch.

17. The circuit as defined in claim 16 wherein said resistance means comprises a pair of serially coupled resistors each having a resistance of at least 1 megohm.

18. The circuit as defined in claim 17 wherein said logic circuit includes a squaring circuit coupled to said latching circuit and said latching circuit comprises a D-flip/flop circuit.

19. The electrical circuit as defined in claim 18 wherein said first named solid-state switch comprises a Triac.

* * * * *

UNITED STATES PATENT AND TRADEMARK OFFICE
CERTIFICATE OF CORRECTION

PATENT NO. : 4,731,548

DATED : March 15, 1988

INVENTOR(S) : Ronald D. Ingraham

It is certified that error appears in the above-identified patent and that said Letters Patent is hereby corrected as shown below:

Column 2, line 56:
"terminal 41" should be —terminal 51—
Column 2, line 64:
"shwon" should be —shown—
Column 4, line 56:
"controlled" should be —controlling—
Column 6, claim 8, line 4:
"electric" should be —electronic—
Column 6, claim 11, line 55:
After "control signal" insert —wherein said input circuit is coupled to—

Signed and Sealed this

Twenty-fifth Day of October, 1988

Attest:

DONALD J. QUIGG

*Attesting Officer*  *Commissioner of Patents and Trademarks*